July 21, 1959 D. MACKEY 2,896,028

PRINTED CIRCUIT FOR HIGH FREQUENCY AMPLIFIER APPARATUS

Filed Sept. 30, 1954 3 Sheets-Sheet 1

INVENTOR.
Donald Mackey
BY H. L. Newton
ATTORNEY

July 21, 1959 D. MACKEY 2,896,028

PRINTED CIRCUIT FOR HIGH FREQUENCY AMPLIFIER APPARATUS

Filed Sept. 30, 1954 3 Sheets-Sheet 2

INVENTOR.
Donald Mackey
BY H. L. Newton
ATTORNEY

July 21, 1959 D. MACKEY 2,896,028

PRINTED CIRCUIT FOR HIGH FREQUENCY AMPLIFIER APPARATUS

Filed Sept. 30, 1954 3 Sheets-Sheet 3

INVENTOR.
Donald Mackey
BY H. L. Newton
ATTORNEY

United States Patent Office 2,896,028

Patented July 21, 1959

2,896,028

PRINTED CIRCUIT FOR HIGH FREQUENCY AMPLIFIER APPARATUS

Donald Mackey, Haddon Heights, N.J., assignor to Radio Corporation of America, a corporation of Delaware Application September 30, 1954, Serial No. 459,366

4 Claims. (Cl. 179—171)

This invention relates to printed circuitry for high frequency electrical apparatus, and more particularly, to circuits including a plurality of printed high frequency inductive windings disposed in close physical relationship on suitable supporting panels.

As used herein, the term printed or printed circuit refers to substantially two dimensional conductive circuit elements supported in coplanar relation on an insulating panel without regard to the method of forming the conductive portions. Printed circuits are considerably less expensive than conventional circuits which employ separately wound coils, transformers and the like, since the components as printed are far less expensive than conventional components and from the additional feature that electrical connections are more easily made to the printed circuit structure by dip-solder techniques and the like. By virtue of certain inherent characteristics of printed circuits, however, their use as applied to transformer or to inductive windings in general, has been restricted to an extent which precludes the realization of their full advantage. The major problem stems from the fact that a plurality of high frequency transformers such as interstage coupling transformers, printed side by side on the same supporting panel, are ordinarily subject to undesirable feedback caused by mutual inductance, "linking currents," radiation and the like. Thus, for example, while printed inductors have been used heretofore, commercial receiver designers have found it impractical to print a plurality of interstage coupling transformers or inductors on the same insulating supporting panel due to an undesirable amount of feedback and interaction caused by the proximity of the windings.

It is therefore a primary object of the present invention to provide an improved printed circuit panel having a plurality of coupling transformers mounted in juxtaposition for use in a multi-stage amplifier, which transformers are substantially free of undesirable feedback.

Another object of the invention is to provide an improved printed circuit for high frequency apparatus having a plurality of printed inductive windings or transformers supported in juxtaposition on an insulating supporting panel, which is substantially immune to undesirable feedback effects.

In accordance with a specific form of the present invention as embodied in a printed circuit for an intermediate frequency amplifier, a plurality of amplifier coupling transformers are mounted on a suitable supporting panel. The several coupling transformers, which may be bifilar windings, are printed on the same supporting panel and are isolated from each other through an arrangement of conductive areas which may be connected to the receiver chassis or ground, and which are disposed in special relationship with respect to the transformers. The conductive areas are formed in a pattern such that at least some of the transformers are completely enclosed thereby. The conductive areas enclosing the transformers form in effect, short-circuited turns which act as magnetic shields to reduce the external field around the windings and also act as an electrostatic shield around the windings.

Hence, it is a further object of this invention to provide a novel printed circuit for high frequency amplifiers including printed transformers in side by side relation which are shielded by discrete printed conductive areas surrounding at least some of said transformer windings.

The novel features that are considered characteristic of this invention are set forth with particularity in the appended claims. The invention itself, however, both as to its organization and method of operation, as well as additional objects and advantages thereof, will best be understood from the following description when read in connection with the accompanying drawings, in which:

Figures 1, 2:
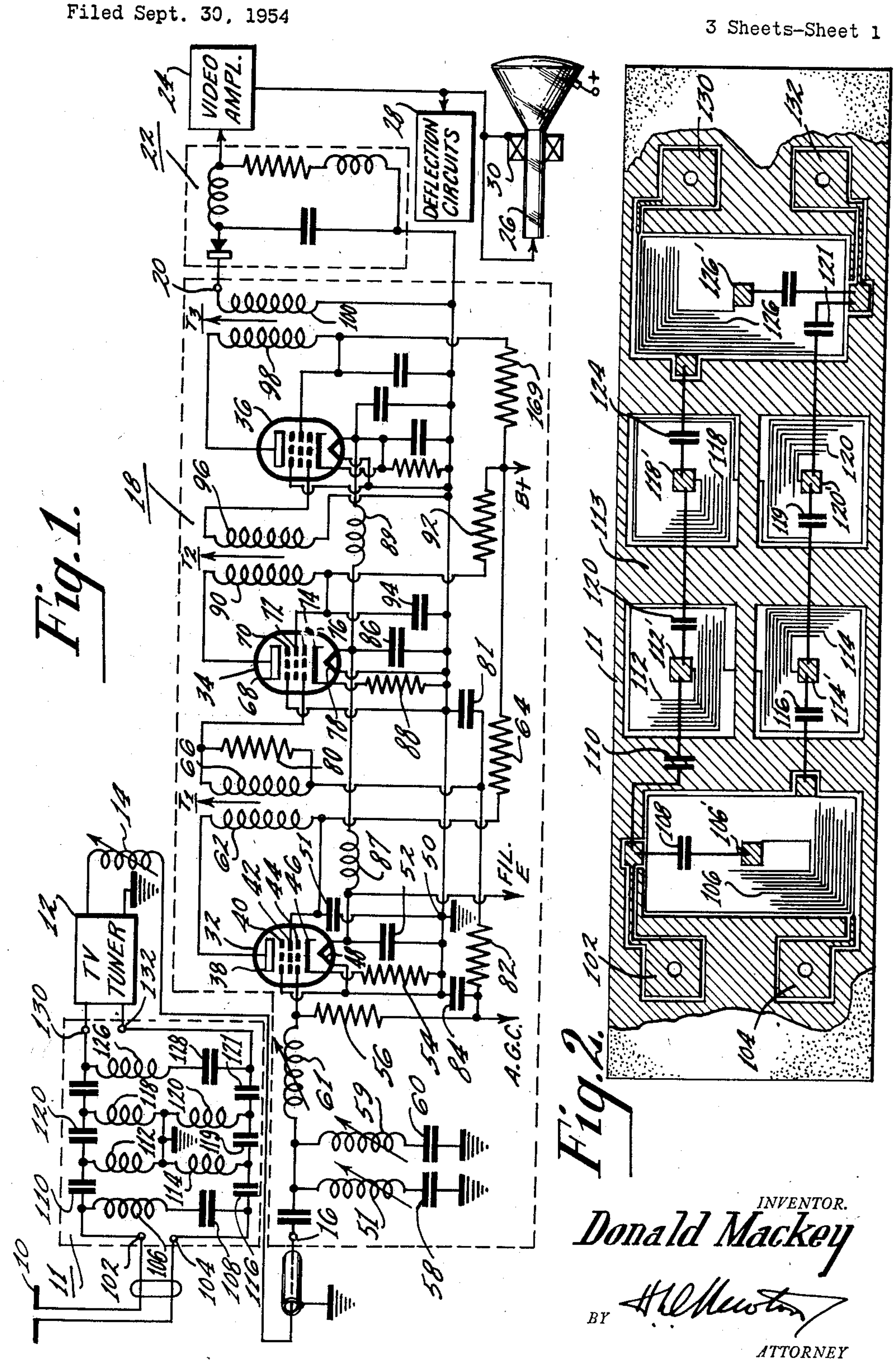
Figure 1 is a circuit diagram representative of a television receiver including a schematic circuit diagram of the printed circuit high pass antenna filter and intermediate frequency amplifier embodying the invention, and including other portions of the television receiver in block form.
Figure 2 is a plan view of a printed circuit 300 ohm high pass antenna filter constructed in accordance with the invention and shown in schematic circuit form in Figure 1.

In order to simplify the description of the present invention and to render the printed circuits more readily understandable, the operational aspects of the intermediate frequency (I.F.) transformer strip as embodied in a television receiver will now be described. In Figure 1 there is illustrated a television receiver including an antenna 10 for intercepting television carrier waves which are then conveyed to a tuner 12 which may, for example, comprise the usual radio frequency (R.F.) stages and a mixer. The antenna 10 is coupled to the tuner 12 through a 300 ohm high pass antenna filter enclosed within the dashed line rectangle 11. The antenna filter which may be used with television receivers having 20 mc. or 40 mc. I.F. systems, consists of a constant K, T section with M derived matching half sections on each end designed to match a 300 ohm balanced line with the input impedance of the R.F. tuner 12 which is ordinarily on the order of 300 ohms. The frequencies of extremely high attenuation for the M derived sections are 25 mc. and 43 mc., and the cut-off frequency is approximately 54 megacycles.

The output of the tuner 12 is coupled through a variable inductance winding 14 to an input terminal 16 of the I.F. amplifier which is enclosed in a dashed rectangle. The intermediate frequency waves after amplification, are available at an output terminal 20 of the I.F. amplifier 18 and are applied to a video detector illustrated schematically within a dashed-line rectangle 22. The composite video signal is, after detection, amplified by a video amplifier such as indicated by block 24 and applied to the intensity controlling electrode (not shown) of a kinescope 26. The video signal is also applied to the deflection circuits 28 which serve to drive the sawtooth deflection currents of horizontal and vertical frequency through the electromagnetic yoke 30 associated with the kinescope.

Referring more particularly to the I.F. amplifier 18, it may be seen from Figure 1 that the strip comprises three pentode electron amplifier tubes 32, 34, and 36. The amplifier 32 includes an anode 38, a suppressor grid 40, a screen grid 42, a control grid 44 and a cathode 46 which is indirectly heated by a filament 48. The suppressor grid 40 and one end of the filament 48 are connected to a point of fixed reference potential 50 or ground. The other end of the filament 48 is connected to ground through a bypass capacitor 52 which presents low impedance to signals of the intermediate frequency. A cathode biasing resistor 54 which is connected between the cathode 46 and ground to provide operating bias potential for the amplifier tube 32, is unbypassed to provide a predetermined degree of degeneration thereby improving the stability of operation of the amplifier 32. The control grid 44 of the amplifier 32 is connected through a resistor 56 to a source of AGC potential, not shown, which varies in magnitude in accordance with the strength of the signal received by the television receiver.

The output signal from the tuner 12 is passed through an M derived filter which is designed to match the output impedance of the tuner 12 with the input impedance of the I.F. amplifier. The half sections comprise the series combination of a variable inductor 57 and a capacitor 58, and a variable inductor 59 and a capacitor 60 respectively. The inductance value of the inductors 57 and 59 may be adjusted in a manner as will hereinafter be described so that the filter may be adjusted to reject undesired signals from the intermediate amplifier 18. The I.F. signals are coupled from the legs of the filter through a variable input inductor 61 to the control grid 44 of the amplifier 32.

The anode 38 of the amplifier 32 is connected through a winding 62 of a bifilar transformer $T_1$, and a resistor 64 to a source of polarizing potential +B. The screen grid 42 is connected to the junction of the winding 62 and the resistor 64.

A secondary winding 66 of the bifilar transformer $T_1$, which is coupled to the primary winding 62 conveys the I.F. signals amplified by the tube 32 directly to the control grid 74 of the amplifier 34. The primary winding 62 is tuned to the intermediate frequency by the inherent capacitance existing between the anode 38 and ground. Likewise, the secondary winding 66 is tuned to the intermediate frequency by the input capacitance of the tube 34. The frequency of resonance of the primary and secondary circuits may be varied by a suitable tuning means as will hereinafter be described in connection with Figure 3.

The amplifier 34 includes an anode 68, a suppressor grid 70, a screen grid 72, a control grid 74, and a cathode 76 which is indirectly heated by a filament 78. The secondary winding 66 of the transformer $T_1$ is shunted by a resistor 80 and is connected through an isolating resistor 82 to the source of AGC potential. The capacitors 81 and 84 are connected from either side of the resistor 82 to ground to provide further filtering of the AGC potential. The suppressor grid 70 and one terminal of the filament 78 are connected with the ground line 50, while the other end of the filament 78 is connected to ground through a bypass capacitor 86. An unbypassed cathode resistor 88 is connected between the cathode 76 and ground to provide operating bias potential for the amplifier tube 34. The anode of the amplifier 34 is connected through a winding 90 of the bifilar transformer $T_2$ and a resistor 92 to the source of polarizing potential +B, and the screen electrode 72 which is connected to the low signal potential side of the winding 90 is bypassed to ground through a signal bypass capacitor 94.

A secondary winding 96 of the bifilar transformer $T_2$ is coupled to the primary winding 90 to convey signals developed thereacross to the control electrode of the amplifier 36. The signal is amplified in amplifier 36 in a manner similar to that described for amplifiers 32 and 34, and is developed across the primary winding 98 of the bifilar transformer $T_3$. Signals developed across the primary windings 98 are coupled to the secondary winding 100 of the transformer $T_3$ and applied to the output terminal 20.

The filaments of the amplifiers 32, 34, and 36 are energized by a source of filamentary energizing potential E. The filament 48 and the filament 78 are isolated from one another by a choke 87 which presents a high impedance to signals of the intermediate frequency, and similarly the choke 89 isolates the filament of the tube 36 from the filament 78. The chokes 87 and 89 serve, by virtue of their connection between the filaments of the three tubes, to prevent feedback of the signal frequencies between the tubes.

From the foregoing, it should be appreciated that the I.F. signal applied to the input terminal 16 of the printed circuit strip 18 is successively applied by the tubes 32, 34, and 36 thereby to provide at the output terminal 20 which is connected to one terminal of the secondary winding 100 of the output transformer $T_3$, a greatly amplified intermediate frequency signal. It should be borne in mind that ground as employed herein refers to a point of reference potential such as is available by connection to the chassis of the receiver.

In Figure 2, there is illustrated the printed circuit 300 ohm high pass antenna filter strip which is constructed in accordance with the invention. In order to illustrate which of the components of the printed circuit strip correspond to the elements in the schematic circuit diagram enclosed within the dashed rectangle 11 of Figure 1, the same reference numerals will be employed in Figure 2, as were used in Figure 1. A pair of input contact tabs 102 and 104 are provided for connection respectively with the connecting cable to the television receiving antenna 10. One end of a printed inductance winding 106 is connected with the terminal 104 and the other end of that winding 106 terminates in the contact tab 106' and is connected through a capacitor 108, not printed on the panel, to the input terminal 102. Four printed inductors 112, 114, 118 and 120 are provided in spaced relation on the panel 11. Each of the inductors is provided at one end thereof with a contact tab 112', 114', 118' and 120' respectively and the remaining ends of each of the inductors is connected with a conductive area 113 which surrounds each of the inductors on the printed circuit strip. A printed inductor 126 is serially connected from a tab 126' at one end thereof to a capacitor 128. The series combination is connected across the output terminals 130 and 132 of the high pass filter. To complete the filter structure a capacitor 110 is connected between the terminal 102 and the contact tab 112; and the capacitor 116 is connected between the terminal 104 and the contact tab 114'. The capacitor 120 is connected between tne contact tabs 112' and 118' and the capacitor 119 is connected between the contact tabs 114' and 120'. The capacitor 124 is connected between the output terminals 130 and the contact tabs 118' while the capacitor 121 is connected between the output terminal 132 and the contact tab 120'.

Figure 3:
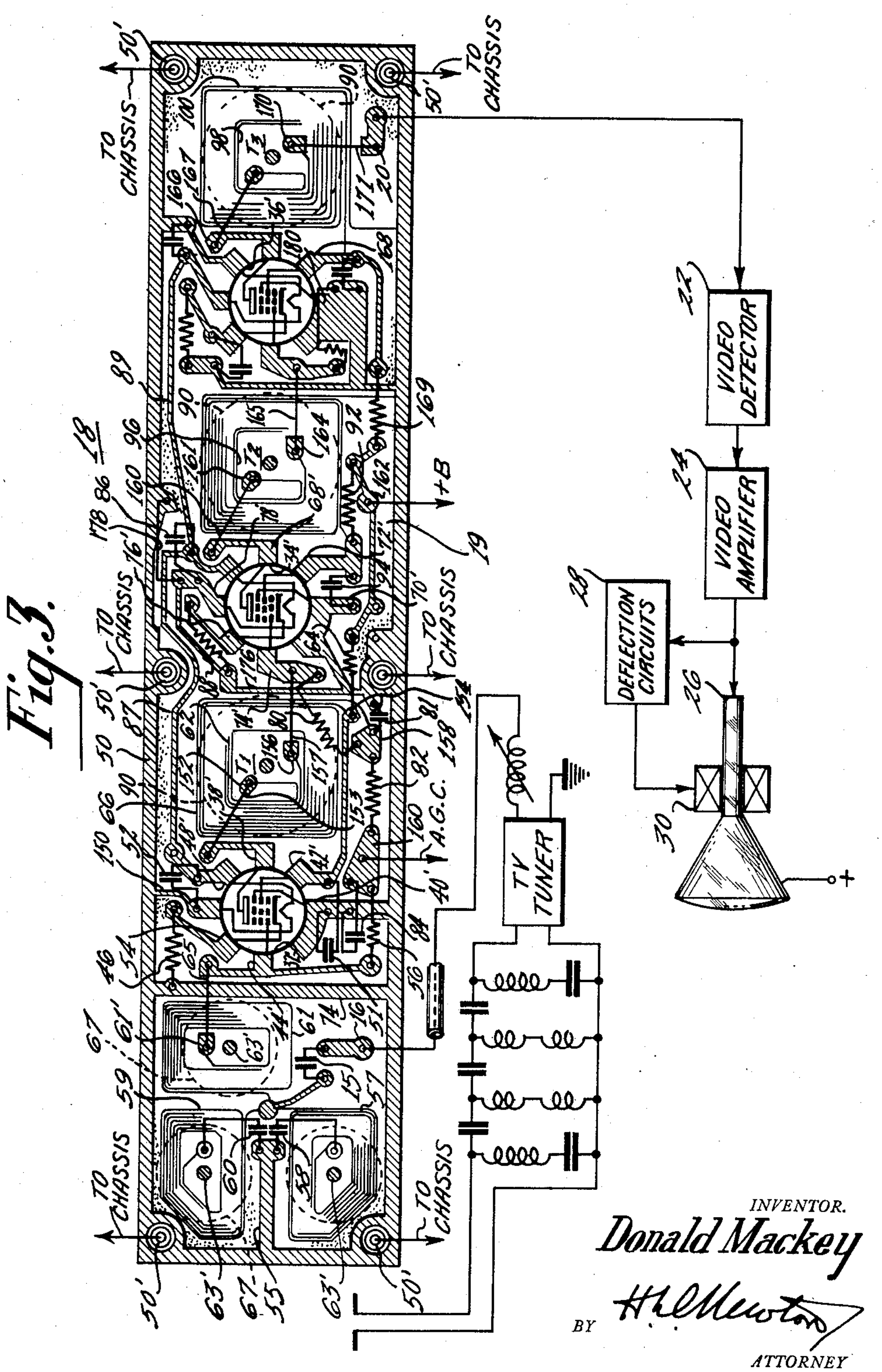
Figure 3 is a plan view of a printed circuit intermediate frequency amplifier embodying the invention and schematically connected to related portions of a television receiver.

A portion of the ground plane 113 is shown in Figure 3 as being broken away and the insulating supporting panel is illustrated by the strippled regions. For proper operation of the antenna filter described above, it is necessary that each of the inductances of the filter be electrically isolated to a predetermined degree one from the other. This is accomplished in accordnace with the invention by providing the ground plane 113 which completely encloses each of the inductive windings to form effectively, short-circuited turns which act as magnetic shields to reduce the magnetic field around the inductors. The ground plane minimizes coupling between adjacent windings and permits the construction of a compact unit.

The input and output terminals of the antenna filter may be provided with mounting feet at one end thereof so that the filter can be assembled to the television receiver chassis with one of the tuner mounting screws so that the leads between the filter and the tuner may be kept as short as possible. The conductive ground plane is conductively connected with the tuner chassis by means of the mounting screws to maintain the ground plane 113 at the same reference potential as the tuner chassis.

In Figure 3, there is illustrated a printed circuit I.F. strip 18 which corresponds element for element to the I.F. strip 18 of Figure 1. The same reference numerals will be employed in Figure 3 as employed in Figure 1 insofar as possible. The other portions of the television receiver shown in diagrammatic form in Figure 1 are also shown in Figure 3 for the purpose of further clarifying the environment of the invention.

While the specific manner of producing the printed circuit I.F. strip 18 does not constitute a part of the present invention, the strip may take the form of a panel or support made of a phenolic or other insulating material 19 having sufficient mechanical strength and rigidity to support the various components. In the drawing, the insulating material 19 is illustrated by the stippled regions, while the conductive areas which may, for example, comprise a copper film suitable configuration, are not stippled. The panel is provided with three substantially circular apertures 32′, 34′, and 36′ for receiving miniature electron tube sockets in proper relation to the board. The sockets are located within the apertures in such a manner that each of the tube pin contact terminals is properly located in alignment with each of the contact terminal tabs arranged about the periphery of the apertures.

The contact tab 16 on the strip corresponds to the input terminal of the I.F. strip and is located with respect to the M derived input filter such that the contact terminal for the inductors 57, 59, and 61 is adjacent thereto and is connected therewith through the capacitor 15. A conductive layer of copper or the like "printed" on the phenolic support 19 is indicated by the numeral 50 and extends, as shown, around the periphery of the panel. The conductive area 50 which forms the ground plane contains circular apertures 50′ which are adapted to receive bolts or other fastening means for securing the strip 18 to the chassis (not shown) of the receiver. In this manner, the ground plane area 50 is effectively connected electrically to the chassis and provides a point of fixed reference potential or ground.

The input inductors 57 and 59 are serially connected between the input terminal to an extension of the ground plane 55 through the capacitors 58 and 60 respectively. The inductor 61 has a contact tab 61′ which is connected by means of a jumper wire 65 with a contact tab 44′ for the control grid 44 of the amplifier 32. The contact tab 44′ is located such that the control grid of the tube 32 is in electrical contact therewith through an appropriate tube socket. The inductors 57, 59, and 61 may be tuned by means of the aluminum discs 63 which are provided for each of the inductors. The aluminum discs each have a threaded shaft which may be screwed into or out of the tapped apertures 63′ which are provided in the board 19 to vary the tuning of the inductors.

As mentioned above, the contact tab 44′ is located with respect to the aperture 32′ such that the contact terminal for the control grid of tube 32 is in electrical contact therewith. In a similar manner, the tab 46′ contacts the cathode of the tube 32 while the tabs 38′ and 42′ contact its anode and screen grid respectively. An extension 150 of the ground area 50 reaches a point on the aperture 32′ for contact with one terminal of the filament of the tube 32 as illustrated. The other terminal of the filament makes electrical contact with the tab 48′ which constitutes the terminus of a printed conductor 87 which serves as the filament supply potential bus.

Also printed on the board 19 between the locations of the tube receiving apertures 32′ and 34′ is the bifilar transformer $T_1$. The two ends of its primary winding 62 terminate respectively in the tabs 152 and 154. The anode of the tube 32 is connected to one end of the primary windings 62 (i.e. tab 152) through the contact tab 38′ and a jumper or wire conductor 153. The other end (the contact tab 154) of the primary winding 62 is connected with the screen grid of the tube 32 through the contact tab 42′. The contact tab 154 is also connected through a resistor 64 to a source of polarizing potential +B, which resistor and source are indicated in Figure 1 by the same reference characters.

The secondary winding 66 of the transformer $T_1$ terminates respectively in the contact tabs 156 and 158. The secondary winding 62 is directly connected from the contact tab 156 through a wire jumper conductor 157 on the reverse side of the panel 19 to a contact tab 74′ which is connected to the control grid of the tube 34. The other end of the secondary winding 66 is connected from the contact tab 158 to an AGC contact tab 160 through a resistor 82. The AGC contact tab 160 which is suitably bypassed to ground by a capacitor 84 is also connected through the resistor 56 to the contact tab 44 which is connected with the control grid of the tube 32.

Extending radially outwardly from the aperture 34′ are conductive tabs 76′, 78′, 68′ and 72′, in addition to those already mentioned. These tabs make electrical contact with the cathode, filament, anode and screen grid of the tube 34 respectively. The anode of the tube 34 is, in a manner similar to that described with respect to the anode of the tube 32, connected to one end of the primary winding 90 of the transformer $T_2$ via tab 68′, and the jumper 160, and a tab 161. The screen grid tab 72′ is connected to the other end of the primary winding of the transformer $T_2$ and is further connected by way of the resistor 92 to the terminal 162 which is connected in turn to a source of positive operating potential for the tubes 32, 34, and 36. One end of the secondary winding 96 of the transformers $T_2$ is connected with the ground area 50, while the other end of the secondary winding 96, terminating in tab 164, is connected through a jumper wire 165 to the control grid tab of the tube 36. Since the contact tabs surrounding the aperture 36′ are substantially the same both as to location and function as those described with respect to the aperture 34′, they are not described further.

The anode of the tube 36 is connected to one end of the primary winding of the output transformer $T_3$ by means of a conductive tab 166 and the jumper wire 167, while the other end of the primary winding is connected with the screen grid tab 168. The screen grid tab 168 is further connected through a resistor 169 to the terminal tab 162 which, as mentioned hereinbefore, is connected to the source of the polarizing potential +B. Insofar as the secondary winding of the output transformer $T_2$ is concerned, it is to be noted that one end thereof terminates in a tab 170 which is connected by way of a jumper 171 to the I.F. output terminal 20, while the other end is connected with the ground area 50. The primary and secondary windings of the interstage coupling transformers $T_1$, $T_2$, and $T_3$ and the output and input capacities of the tubes and of the video detector resonate at the intermediate frequency. The primary and secondary circuits may be tuned by the aluminum discs 190. The discs are mounted to be movable toward or away from the panel 19 to vary the inductance of the transformer windings.

As mentioned above, the conductive ground plane area 50 extends continuously around the periphery of the panel 19. A conductive area 174 extends across the width of the panel between the input filter location and the aperture 32′, and is in connection with the conductive area 50 on opposite edges of the panel. The conductive area 174 together with the conductive area 50, provide a continuous loop which provides in effect a short-circuited turn around the input filtering section to reduce the external magnetic field and, hence, provide magnetic shielding of the input filter section. At the left hand side of the panel a conductive portion 55 extends from the ground area 50 between the inductors 57 and 59 to provide a shielding effect between these inductors.

Located between the transformer $T_1$ and the aperture 34′ is a printed conductor 176 which extends from the lower ground area 50 to the top end of the contact tab 78′. A jumper wire 178 connects the contact tab 78′ with the ground area 50 on the opposite or top side of the board. These conductors together with the ground plane 50, and the conductive area 174, form a short-circuited loop about the transformer $T_1$ thereby acting as a magnetic shield to reduce the external field around $T_1$.

The tube socket for the aperture 36′ provides a conductive connection between the contact tabs 180 and 182. Since the contact tab 180 is connected to the ground plane 50 on one side of the panel and the contact tab 182 is connected to the ground plane 50 on the other side of the panel, a complete circuit connection is provided across the panel 19 through the tube socket. This circuit path in combination with the ground plane 50 and the conductor 176 and the jumper 178, provides a short-circuited turn completely enclosing the transformer $T_2$. Furthermore, the conductive path including the contact tabs 180 and 182 together with the ground plane 50 at the right hand end of the panel 19, provide a short-circuited turn around the transformer $T_3$. These conductive areas provide a magnetic shield for the transformers $T_2$ and $T_3$ respectively, preventing excessive undesirable "linking" or coupling between the transformers. This structure enables the construction of a compact and efficient I.F. strip with relatively close placement of the transformers with respect to each other.

Figure 4:
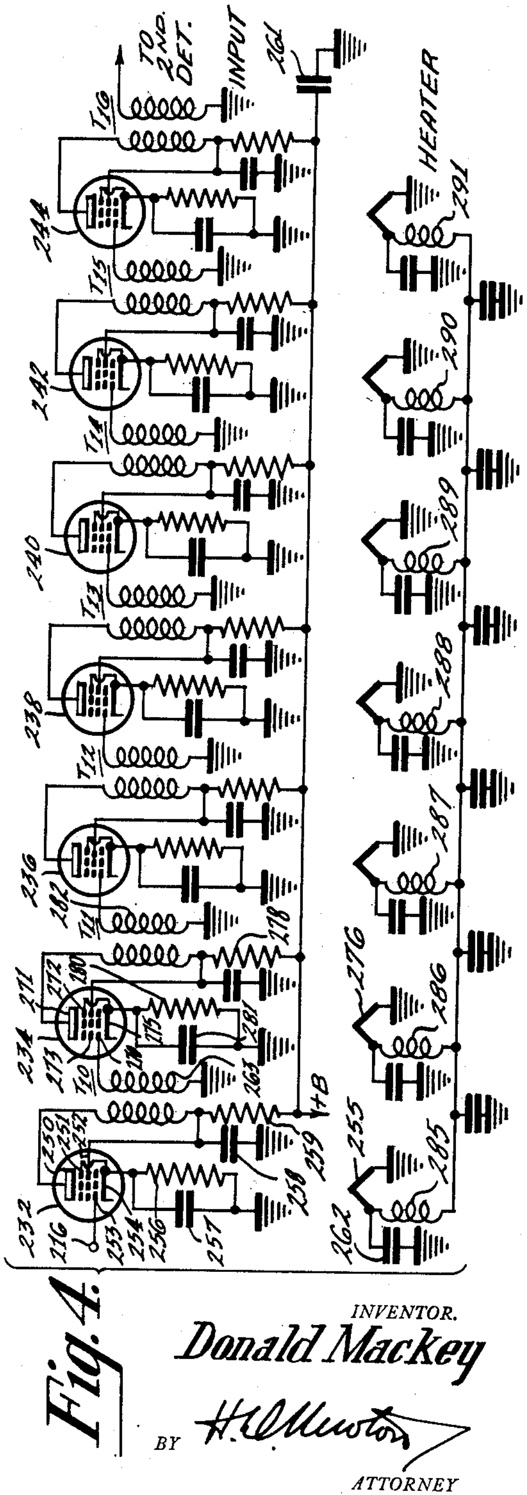
Figure 4 is a schematic circuit diagram of a wideband intermediate frequency amplifier.

Referring now to the schematic circuit diagram of the amplifier shown in Figure 4, showing another embodiment of the invention, it may be seen that the high frequency wide band I.F. amplifier comprises seven pentode electron tube amplifiers 232, 234, 236, 238, 240, 242, and 244. The amplifier is provided with an input terminal 216 to which suitable input signals from a source not shown may be applied. The input signals are coupled from the terminals 216 to the control electrode of the amplifier 232. The amplifier tube 232 includes an anode 250, a suppressor grid 251, a screen grid 252, a control grid 253, and a cathode 254 which is indirectly heated by a filament 255. The suppressor grid 251 and one end of the filament 255 are connected to a point of fixed reference potential or ground. The other end of the filament 255 is connected to ground through a bypass capacitor 262 which presents low impedance to signals of the intermediate frequency.

A cathode biasing resistor 256 is connected between the cathode 254 and ground to provide operating bias potential for the amplifier tube 232. The cathode bias resistor 256 is bypassed by a capacitor 257 which has a relatively low impedance for signals of the operating frequency. The anode circuit 250 of the amplifier 232 includes a series circuit comprising a primary winding 260 of a bifilar transformer $T_{10}$, and a resistor 259 which is connected between the anode 250 and a source of energizing potential +B. The screen grid 252 is connected with the junction of the winding 260 and the resistor 259, and high frequency signal potentials on the screen grid are bypassed to ground through a capacitor 258. A capacitor 261 shown on the right hand end of the power supply line, is connected from the +B terminal to ground by a low impedance path to keep signal potentials out of the power supply. The primary and secondary windings 260 and 263 of the bifilar transformer $T_{10}$ are tuned to the intermediate frequency by means of the inherent output capacity of the amplifier 232 and the inherent input capacity of the amplifier 234. The amplified signal potential developed in the primary winding 260 is coupled to the secondary winding 263 one end of which is directly connected with the control grid of the amplifier tube 234. The other end of the secondary winding is connected with ground.

The amplifier tube 234 includes, as shown, an anode 271 and a suppressor grid 272, a screen grid 273, a control grid 270, a cathode 275, which is indirectly heated by a filament 276. The anode 271 of the amplifier tube 234 is connected through a primary winding 277 of a second bifilar transformer $T_{11}$ and a resistor 278 to the +B terminal. A cathode bias resistor 280 is connected between the cathode 275 of the amplifier tube 234 and ground, and serves to furnish the operating bias potential for that tube. A bypass capacitor 281 is connected across the terminals of the biasing resistor 280 to provide a low impedance path to ground for signals of the intermediate frequency.

The amplified intermediate frequency signals developed in the primary windings 277 are coupled to the secondary winding 282 of the bifilar transformer $T_{11}$, and are directly connected with the input or control grid of the amplifier tube 236. The intermediate frequency signal is then amplified successively by the amplifier tubes 236, 240, 242, and 244 and the interstage coupling means between the amplifier tubes is substantially the same as that described between the amplifier tubes 232, and 234, and 234 and 236.

Each of the tubes has a cathode which is indirectly heated by a filament. The filaments are shown below the amplifier circuit to more conveniently and clearly illustrate the operation thereof. The chokes 285, 286, 287, 288, 289, 290, and 291 are connected in series with each of the filaments of the seven tubes to provide a high impedance at the signal frequency between the filaments and the filament power supply to prevent feedback and interaction of the signal frequencies.

Figure 5:
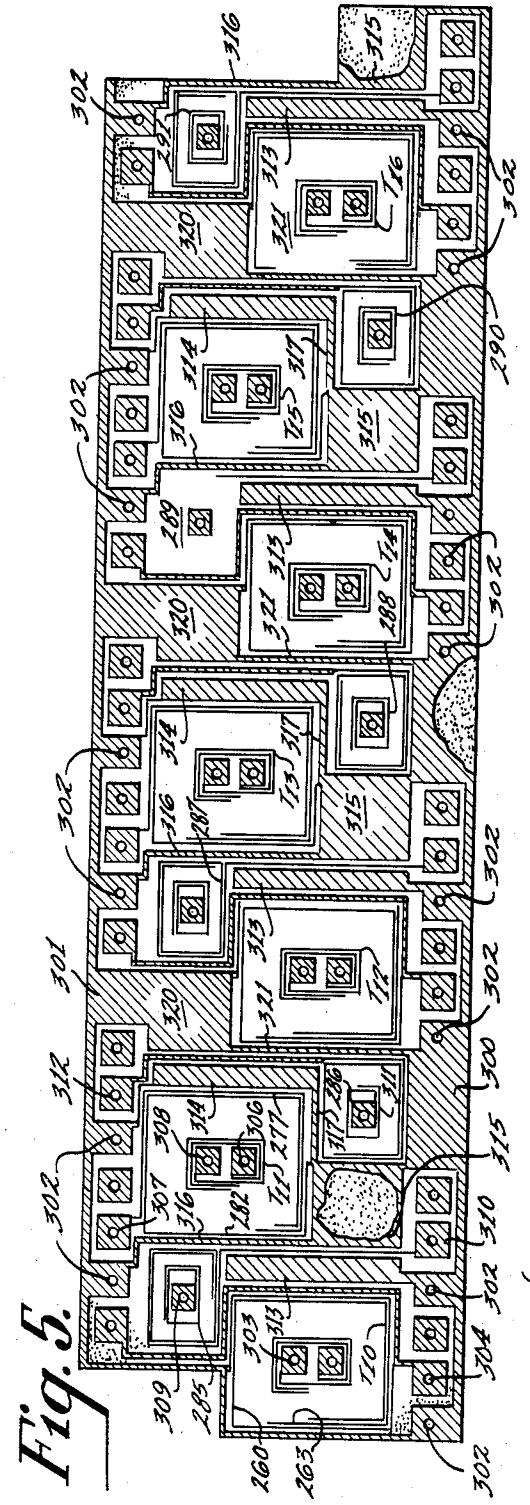
Figure 5 is a plan view of a printed circuit transformer strip embodying the invention, which contains the transformer windings and choke coils of the intermediate frequency amplifier shown in Figure 4.

Referring now to Figure 5 there is illustrated a printed circuit panel which contains the intermediate frequency amplifier interstage coupling transformers $T_{10}$, $T_{11}$, $T_{12}$, $T_{13}$, $T_{14}$, $T_{15}$ and $T_{16}$, and also each of the filament chokes 285, 286, 287, 288, 289, 290, 291 of the high frequency amplifier shown in Figure 4. The circuit components and tubes not actually printed on the panel are not shown in Figure 4. A pair of ground areas 300 and 301 extend along the opposite lengthwise edges of the strip and are provided with contact tabs 302 through which connecting bolts may pass and provide a conductive connection between the ground areas 300 and 301 of the printed circuit panel and the amplifier chassis. The transformers $T_{10}$ to $T_{16}$ are successively positioned along the length of the board in staggered relation to provide a minimum amount of inductive coupling between adjacent transformers. The two ends of the primary winding 260 of the bifilar transformer $T_{10}$ terminate, respectively, in the tabs 303 and 304. The anode of the amplifier tube 232 is connected to one end of the primary winding 260, tab 303, and the other end of the primary winding 260 is connected to the screen grid 252 through the contact tab 304. The secondary winding 263 of the transformer $T_{10}$ terminates at one end in a tab 305 which is connected to the control grid 270 and the amplifier tube 234, while the other end of the secondary winding 263 is connected to the ground area 300.

The coupling transformer $T_{11}$ has primary and secondary bifilar windings which are connected in a similar manner between the output of the amplifier tube 234 and the input electrode of the amplifier tube 236. The primary winding 277 of the transformer $T_{11}$ has a pair of terminals 306 and 307 which are respectively connected to the anode 271 and the screen grid 273 of the amplifier tube 234. The secondary windings 282 of the coupling transformer $T_{11}$ has one end connected to a conductive tab 308 from which connections are made to the control grid of the amplifier tube 236. The other end of the secondary winding 282 is connected to the ground planes 300 and 301. Similar connections are made between each of the bifilar coupling transformer windings $T_{12}$, $T_{13}$, $T_{14}$, $T_{15}$, and $T_{16}$ and the amplifier tubes which are coupled thereby.

Positioned adjacent the transformer $T_{10}$ is the filament choke 285 which has opposite ends thereof connected with terminal tabs 309 and 310. The choke 285 is positioned at the upper right hand end of the transformer $T_{10}$ and to one side of the transformer $T_{11}$. The filament choke 286 has the opposite ends thereof connected with terminals 311 and 312, and is located adjacent the windings $T_{11}$ and $T_{12}$. In like manner the filament chokes 287, 288, 289, 290 are positioned with respect to the other transformers. The inside terminals of the filament chokes are connected with the filamentary power supply connection lead while the outside terminals are grounded. Thus, the ends of the chokes nearest ground potential are adjacent the coupling transformers thereby minimizing any interaction between the filament chokes and the coupling transformers.

Extending from the ground area 300 along the right hand side of the transformers $T_{10}$, $T_{12}$, $T_{14}$, and $T_{16}$ are heavy conductive areas 313 which serve to partially shield the transformer from undesired coupling. Extending from the ground area 301 along the right hand side of the transformers $T_{11}$, $T_{13}$, and $T_{15}$ are heavy conductive areas 314 which partially shield these transformers from the circuit elements on the right hand side thereof. A third set of heavy conductive areas 315 extend from the ground plane 300 adjacent the bottom side of the odd numbered and at the right side of the even numbered transformers. Part of the area 315 adjacent the transformers $T_{10}$ and $T_{11}$ is broken away to show the panel which is indicated by the stippled regions. The conductors 316 extend from the areas 315 to the ground plane 301, and the conductors 317 connect the areas 315 to the areas 314 which are in turn connected to the ground plane 301.

Thus, each of the transformers $T_{11}$, $T_{13}$, and $T_{15}$ are enclosed within a conductive loop comprised of the ground plane 301, the conductor 316, the conductive area 315, the conductors 317 and the conductive areas 314. This area in effect provides the shorted turn which effectively acts as a magnetic shield.

A fourth set of conductive areas 320 extend from the ground plane 301 and are located at the top side of the even numbered transformers and to the right of the odd numbered transformers. The conductive areas 320 are connected by means of a conductor 321 to the ground plane 300. The even numbered transformers $T_{10}$, $T_{12}$, $T_{14}$, and $T_{16}$ are thus enclosed within the conductive loop formed by the ground planes 300 and 301, the conductive areas 320, the conductor 321, the conductive area 315 and the conductor 316. This loop as described above also acts as a shorted turn and acts as a magnetic shield for the transformers.

By way of summary, therefore, it will be seen that the present invention affords a simplified printed circuit structure for a multi-stage, I.F. amplifier for television receivers and the like, which circuit has printed on a single support all of the interstage coupling transformers and inductance elements necessary for the operation of the amplifier. Moreover, by virtue of the configuration of the ground plane areas, isolation of the various printed transformer windings is provided thereby enabling the construction of a plurality of transformer windings in juxtaposition on the same panel without deleterious effects of undesired coupling. Further, the utilization of the invention may be extended beyond coupling transformers and finds application in providing isolation of any inductance elements on a printed circuit panel such as might be used in a filter circuit or the like.

Since, as has been set forth earlier, the specific mode of preparing the printed circuit does not form a part of the present invention, any suitable process may be employed. One highly effective technique, however, is to first secure a metal foil about 1.5 mils (0.0015 inch) thick to a substantially non-conductive carrier sheet. Copper foil on a polymerized phenolformaldehyde resin sheet produces excellent results. The exposed foil surface is then coated with any suitable photo-sensitive layer of the type generally employed in the photo-engraving art. The standard alkaline solution of bichromated shellac commonly known as cold top enamel makes a suitable coating. The coating is kept in subdued light till it is exposed to an intense image of the desired circuit, the conductive circuit portions being light and the background being dark. After a sufficient exposure time, the photo-sensitive coating is treated with a developer, essentially ethyl alcohol where cold top enamel is the photo-sensitive coating, which softens those parts of the coating that have not been exposed to the intense light. The developed coating is then washed in running water which washed off the softened portions. The washing may be assisted by some mechanical rubbing, as with a sponge, to completely detach loose portions. The sheet with the remaining portions of the coating is then subjected to an etching treatment, preferably of the spray type, in which etching fluid that dissolves the metal foil is sprayed against the partially coated surface to be etched. The metal is thereby dissolved from all portions unprotected by cold top enamel, leaving an accurate reproduction of the photographic image.

In accordance with the invention, there has been provided a printed circuit structure which enables the juxtaposition of printed circuit high frequency inductors, or transformers, with a minimum of undesirable coupling between the windings, by providing conductive areas on the printed circuit board which form a loop around the respective windings.

What is claimed is:

1. A high frequency printed circuit transformer system comprising in combination, a flat insulating supporting panel, a plurality of printed circuit transformers affixed to and spaced along one side of the panel, means providing planar conductive areas on said one side of the panel and along respective opposite edges of said panel and means providing further planar conductive areas positioned on said one side of the panel between adjacent printed circuit transformers and interconnecting said first named areas such that each of said printed circuit transformers is surrounded by a continuous conductive loop coplanar therewith.

2. A printed circuit multi-stage signal amplifier of the type having electrical conductors arranged on an insulating support adapted to be mounted on a chassis, comprising a first amplifier stage location, a second amplifier stage location, a transformer printed between said locations for operatively coupling said first amplifier to said second amplifier, an output terminal, a transformer printed between said second location and said output terminal, means providing a printed area of conductive material surrounding said first transformer and an additional printed area of conductive material enclosing said second transformer, each of said areas serving to form a short-circuited turn thereby acting as a magnetic shield for the enclosed transformer.

3. A printed circuit multi-stage signal amplifier as defined in claim 2 wherein said conductive areas are connected with said chassis.

4. A printed circuit structure for use with a source of signals and a signal utilization device, said printed circuit structure comprising, in combination, a planar insulating panel, a first inductance defined by a first planar configuration of conductive material disposed within a first area on one side of said panel, a second inductance defined by a second planar configuration of conductive material disposed within a second area on said one side of said panel, means for coupling said first inductance to said signal source, means for coupling said second inductance to said signal utilization device, means for establishing a desired path for the transfer of signals between said first inductance and said second inductance, said desired signal transfer path establishing means including a signal transfer element having an input terminal and an output terminal and being independent of said insulating panel but supported thereon, said desired signal transfer path establishing means also comprising means including respective tabs of conductive material disposed within said first area and within said second area for providing an electrical connection between said first inductance and said input terminal and between said output terminal and said second inductance, and means for reducing undesired interaction between said first and second inductances comprising a third configuration of conductive material on said one side of said panel substantially coplanar with said first and second configurations and disposed so as to form a short-circuited turn enclosing one of said areas.

References Cited in the file of this patent

UNITED STATES PATENTS

| | | |
|---|---|---|
| 1,999,137 | Flewelling | Apr. 23, 1935 |
| 2,268,619 | Reid | Jan. 6, 1942 |
| 2,474,988 | Sargrove | July 5, 1949 |
| 2,560,320 | Winkler | July 10, 1951 |
| 2,586,854 | Myers | Feb. 26, 1952 |
| 2,647,224 | Bruck | July 28, 1953 |
| 2,665,376 | Kodama | Jan. 5, 1954 |
| 2,759,051 | Lockwood et al. | Aug. 14, 1956 |

OTHER REFERENCES

Publication: "A Sylvania Technical Article," by Hannahs & Stein, 11 pages, March 1952. A copy may be obtained from the "Technical Relations Dept., Sylvania Electric Products, Inc., 40—22 Lawrence St., Flushing 54, N.Y.

Radio-Electronics: August 1954, pages 80, 81, "Radio Printed Circuit I.F.'s for Hi-Fi F.M. Tuners," by Grodinsky.

Scientific American: vol. 193, No. 2, Aug. 1955, pages 29–33, "Automatic Manufacture of Electronic Equipment."